(12) United States Patent
Zarrineh et al.

(10) Patent No.: US 6,700,946 B2
(45) Date of Patent: Mar. 2, 2004

(54) SYSTEM AND METHOD FOR AUTOMATIC GENERATION OF AN AT-SPEED COUNTER

(75) Inventors: Kamran Zarrineh, Billerica, MA (US); Kenneth House, Arlington, MA (US); Joseph R. Siegel, Shrewsbury, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/071,506

(22) Filed: Feb. 8, 2002

(65) Prior Publication Data

US 2003/0152188 A1 Aug. 14, 2003

(51) Int. Cl.[7] .............................................. H03K 23/00
(52) U.S. Cl. .............................. 377/44; 377/51; 377/55; 377/56
(58) Field of Search ............................. 377/26, 44, 51, 377/55, 56; 365/233, 236

(56) References Cited

U.S. PATENT DOCUMENTS

| | | | | |
|---|---|---|---|---|
| 4,499,589 A | * | 2/1985 | Geesen | 377/55 |
| 4,991,186 A | * | 2/1991 | Payen et al. | 377/44 |
| 5,142,651 A | * | 8/1992 | Cronyn | 377/44 |
| 5,345,109 A | * | 9/1994 | Mehta | 307/271 |
| 6,026,140 A | * | 2/2000 | Owen | 377/51 |
| 6,222,900 B1 | | 4/2001 | Hara | 377/107 |

OTHER PUBLICATIONS

Horowitz and Hill, the Art of Electronics, 1980, Cambridge University Press, p. 358.*

* cited by examiner

Primary Examiner—Margaret R. Wambach
(74) Attorney, Agent, or Firm—Lahive & Cockfield, LLP (57) ABSTRACT

Methods and systems for automatic generation of an at-speed binary counter are described. The binary counter includes a slow counter that increments when a fast counter overflows to keep up with a fast clock. A framework to automatically generate a Hardware Description Language (HDL) for an at-speed binary counter is also described.

22 Claims, 6 Drawing Sheets

FIG. 4 module < module_name > is
begin

LENGTH = < integer > ;
// The length of the counter.

CLOCK_RATE = < floating point > ;
// The clock rate of the counter.

LEVEL_PER_CYCLE = < integer > ;
// Number of levels allowed between each cycle.

RESET = < boolean > ;
// Counter requires reset capability.

RESET_PATTERN = < bit_string > ;
// Reset pattern for the counter, i.e., "00000...00";

PARALLEL_LOAD = < boolean > ;
// Data can be loaded in parallel to the counter.

CAPTURE_DATA = < boolean > ;
// State of the counter can be saved in the set of latches.

MAX_FANOUT = < boolean > ;
// This number specifies the maximum
// fanout allowed for flop/latch
// in the target technology.

end < module_name > ;

SYSTEM AND METHOD FOR AUTOMATIC GENERATION OF AN AT-SPEED COUNTER

TECHNICAL FIELD

The present invention relates generally to computer counters, and specifically relates to automatic generation of at-speed binary counters.

BACKGROUND OF THE INVENTION

A binary counter provides a count signal indicating the number of clock signals received from a CPU clock in a computer. Binary counters have many applications, such as in digital communication systems where a count of the number of clock signals received is used for various purposes by the system. A binary counter typically includes N serially connected stages, each providing an output indicating its state has been changed. The clock signals may be provided synchronously to all stages simultaneously so that the counter output is always correct, or asynchronously to the first stage so that the signal cascades through the stages and the counter output is only correct when the signal has cascaded to the last stage. Outputs from each stage are provided to a decoder array that provides a count signal.

Conventional binary counters suffer important drawbacks. In a typical binary counter, a counting operation is accomplished in response to a counting clock that sends binary count data to a sampling circuit. The circuit first samples count data from the binary counter when a count value signal is read, which is asynchronous with a counting clock signal, and subsequently produces a binary count value. Even if the signal were received when the binary counter performs a counting operation, the circuit outputs the binary count data sampled at the time of the signal occurrence. Since the value attained through the sampling operation is directly outputted from the conventional asynchronous reading circuit, precision of the data cannot be guaranteed.

Additionally, the speed at which binary counters are designed and manufactured using conventional methods can be undesirably low, which can be a serious drawback in an age where electronic devices can quickly become obsolete. Especially for complex Very Deep Sub-Micron VLSI designs, there is a need to reduce the time-to-market to improve profitability. Design flows and synthesis frameworks have been developed to cope with the increasing complexity of the designs and to reduce the time-to-market of a product. However, there is a limit to the benefits of the design flows and synthesis frameworks and therefore reuse of components has been regarded as a key enabler to take advantage of the high-end manufacturing technologies and system design tools. In applications where the length of the binary counters is large and the timing constraints on the counters are aggressive, (e.g., cycle/event counters in a microprocessor or address counters of memory Built-In Self Test modules), the binary counters have to be custom designed. This is a cumbersome and time-consuming process.

SUMMARY OF THE INVENTION

A binary counter for counting cycles of a processor clock is described herein. The binary counter includes a fast counter coupled to the processor clock via at least one first clock input, the fast counter incrementing by one after every cycle of the processor clock up to a maximum count. The binary counter further includes a slow counter coupled to the fast counter and to at least one second clock input, wherein the slow counter increments by one after one cycle of the processor clock after the fast counter reaches the maximum count. The slow counter may increment on a rising edge of the processor clock when the fast counter wraps around from its maximum count.

The fast and slow counters can include various combinational logic elements, such as AND and OR gates, and registers connected to the clock inputs. Each register may accept signals via a multiplexer. The slow and fast counters may also include a default reset input to reset the binary counter, and an update data in input to set the binary counter to a value different from zero.

Also described herein is a method for counting cycles of a processor clock including a multi-stage binary counter architecture where the number of stages is greater than two. The first stage is an at-speed counter that counts up for every processor clock. This stage is referred to as the fast counter. The next stage counters do not have to be at speed since every count of one stage counter corresponds to one full count of all of its previous stage counters. Each of these stages is called a slow counter in this document.

Additionally, a computer-readable medium is described herein that stores a program for automatically generating the design for a binary counter for counting cycles of a processor clock. The program includes a fast counter generator for generating a fast counter coupled to the processor clock via at least one first clock input, the fast counter incrementing by one after every cycle of the processor clock up to a maximum count. The program further includes one or more slow counter generators for generating a slow counter coupled to the fast counter and to at least one second clock input, wherein the slow counter increments by one after one cycle of the processor clock after the previous stage counter reaches the maximum count. The computer-readable medium may further include an input file containing a clock rate indicative of a speed of the processor clock and a counter length indicative of a length of the binary counter.

BRIEF DESCRIPTION OF THE DRAWINGS

The aforementioned features and advantages, and other features and aspects of the present invention, will become better understood with regard to the following description and accompanying drawings.

DETAILED DESCRIPTION

Hardware architecture of an at-speed Vernier binary counter is provided herein that relies on a fast counter coupled to one or more slow counters to keep up with a fast clock. A framework to automatically generate a Hardware Description Language (HDL), at-speed binary counter is also described below.

Figure 1:
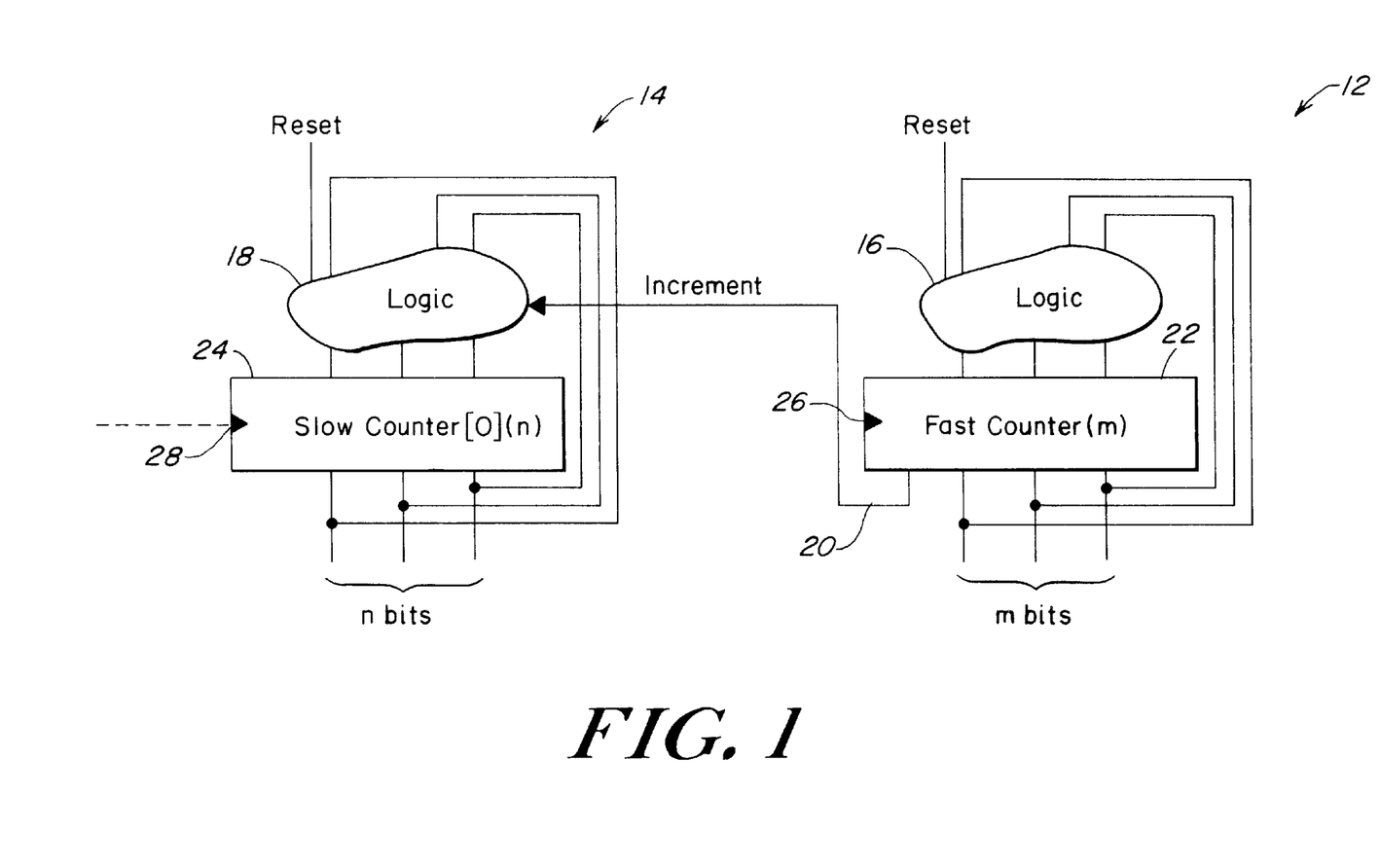
FIG. 1 shows a binary counter architecture according to one embodiment of the present invention.

FIG. 1 depicts a binary counter 10 produced in accordance with the illustrative embodiment of the present invention. The binary counter 10 includes a fast counter 12 and a slow counter 14. Those skilled in the art will appreciate that only two counter stages are shown in the example of FIG. 1 for purposes of simplicity. In alternative embodiments, the binary counter may include more than two counter stages. The fast counter 12 includes fast counter logic 16 and the slow counter 14 includes slow counter logic 18 that may be implemented in a number of different fashions in practicing the present invention. Examples of such logic 16 and 18 are described below. The fast counter 12 is coupled to the slow counter 14 via a coupling lead "increment" 20. The fast counter 12 contains a fast counter register 22 that includes a clock input 26 for receiving a clock signal. The slow counter 14 includes a slow counter register 24 that includes a clock input 28 for receiving a clock signal. The fast counter 12 has a length of m bits and is designed to run at speed, so that every clock cycle can be counted yielding an accurate count.

The fast counter 12 inserts an output signal called the coupling lead "increment" 20 every time it completes one full round of count. For example, assuming "m" equals four, starting from the state "0000," the signal incremented is asserted every time the counter reaches the state "1111." The slow counter is k bits wide (see FIG. 1) and is incremented every time its incremental signal is asserted by the fast counter. Therefore, the slow counter has $2^m$ clock cycles to change its state from x to x+1. In some applications, one slow counter is sufficient. However, if necessary, the slow counter could be divided into two or more slow counters such that the slow counter i creates the incremental signal for slow counter i+1.

Figure 2:
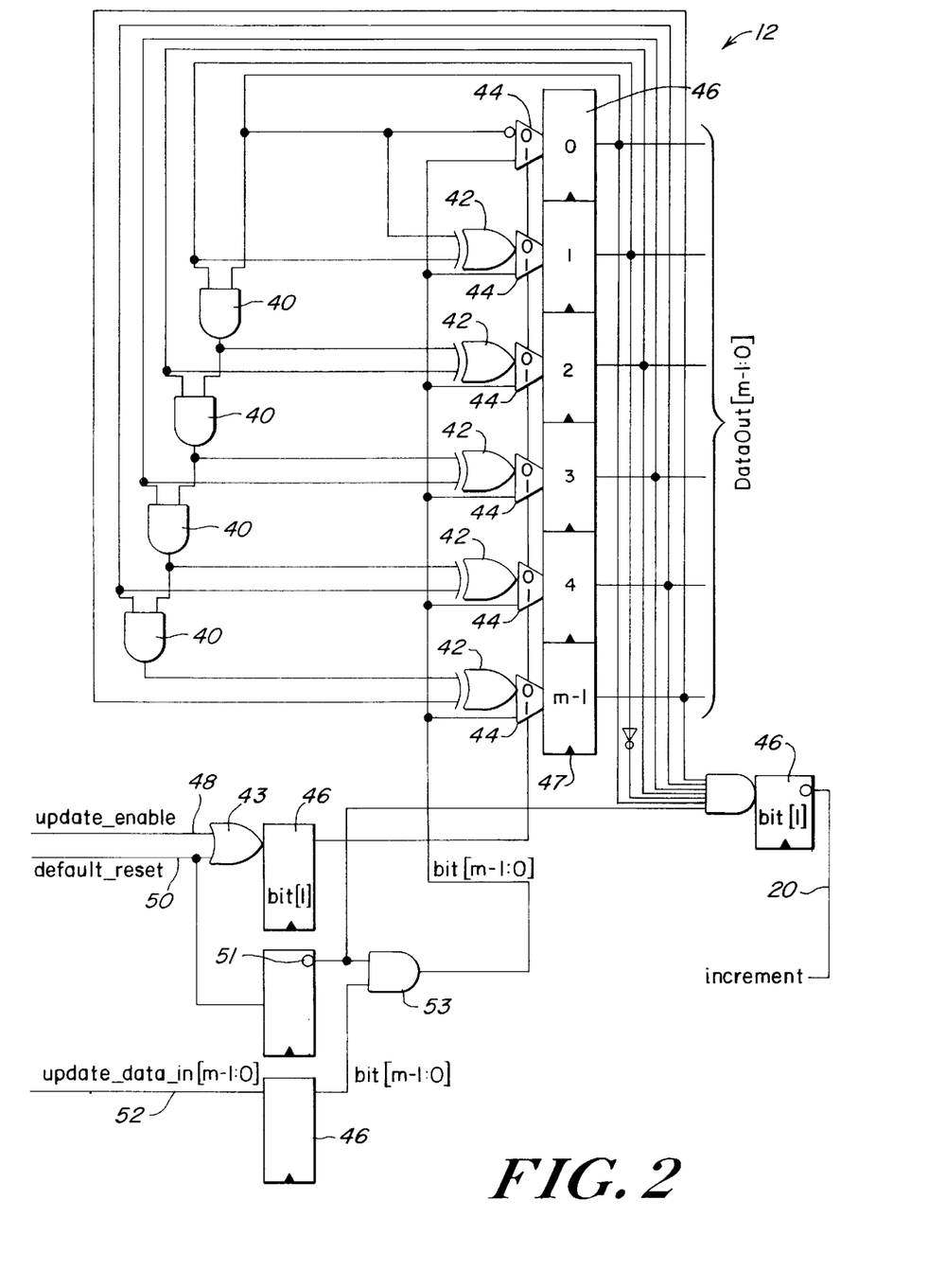
FIG. 2 shows the architecture of the fast counter 22 of FIG. 1 in more detail.

Referring to FIG. 2, a more detailed depiction of an example of the fast counter 12, and register 22 is shown. The fast counter 12 includes several AND gates 40, exclusive OR gates 42, and an OR gate 43. The fast counter 12 includes several multiplexers 44 coupled to registers 46. Each register has a clock input 47. The fast counter also includes an update_enable input 48, a default_reset input 50 and an update_data_in input 52.

The fast counter 12 is designed to run at speed and asserts an output signal every time it completes one, full round of count via the coupling lead 20. At least one module (not shown), such as a service processor or counter interface, schedules events and controls the inputs update_enable 48, default_reset 50, and update_data_in 52. A default_reset 50 signal functions to reset the counter. A default_reset 50 signal of one (or high) is inverted by the inversion function 51 and loads a zero in each of the m registers 46 (six registers, labeled 0 to m-1, are shown in FIG. 2) via the multiplexers 44, thereby resetting the fast counter 12. The update_data_in 52 allows the counter to start from a value that is different from zero after a reset. By asserting the update enable 48, the registers of the counters can be given a different state. When the clock makes a transition or goes through one cycle, the fast counter 12 assumes a new state via clock input 47 signals.

The fast counter 12 has two phases in its operation. In the first phase, the sequential elements in the fast counter 12 are set to logic value 0 by assertion of the default_reset 50 signal for one clock cycle. The asserted default_reset 50 signal forces the input to the pin 1 of the 2:1 multiplexers 44 to logic value 0 and at the same time selects the input pin 1 of the multiplexer 44. At the next clock cycle, logic value 0 is loaded in the sequential elements of the fast counter 12.

The current values stored in the sequential elements register 46 of the fast counter 12 are called the present state of the fast counter 12. The present state of the fast counter 12 is read from the output pins of the sequential elements. The data input pin of the sequential elements determines the next state of the fast counter 12 computed in logic 16. The next state of the fast counter 12 is a function of the present state of the counter 12. For example, when present state is at logic value 0000 assuming a 4-bit fast binary counter, the next state is computed as logic value 0001 since the next state of the first bit is an inverted version of the present state. At present state 0001, the next state of the first bit is logic value 0 while the next state of the second bit is 1 xor 0 that is 1 and therefore the next state is 0010 or decimal number 2.

Once the present state of the fast counter 12 reaches the binary value 11 . . . 101, the next state of the increment signal is asserted. Therefore, when the present state of the counter is 11 . . . 110, the present state of the increment signal is 1. This signal could allow another counter to increment its value or its next state to become its present state. The next state of the counter when the present state is 11 . . . 111 is 00 . . . 000; hence, the fast counter 12 restarts once it has completed its count.

In the second phase of the fast counter 12, it may be necessary to initialize the fast counter 12 with a value different than the logic value 00 . . . 000. In such case, the update_data_in input 52 is used to set the desired logic value from an externally supplied value, e.g., 10 . . . 010. By asserting the update_enable signal 48, the present state of the sequential elements is made in front of these signals and the next state of the counter is then set to the desired initial value, e.g., 10 . . . 010.

Figure 3:
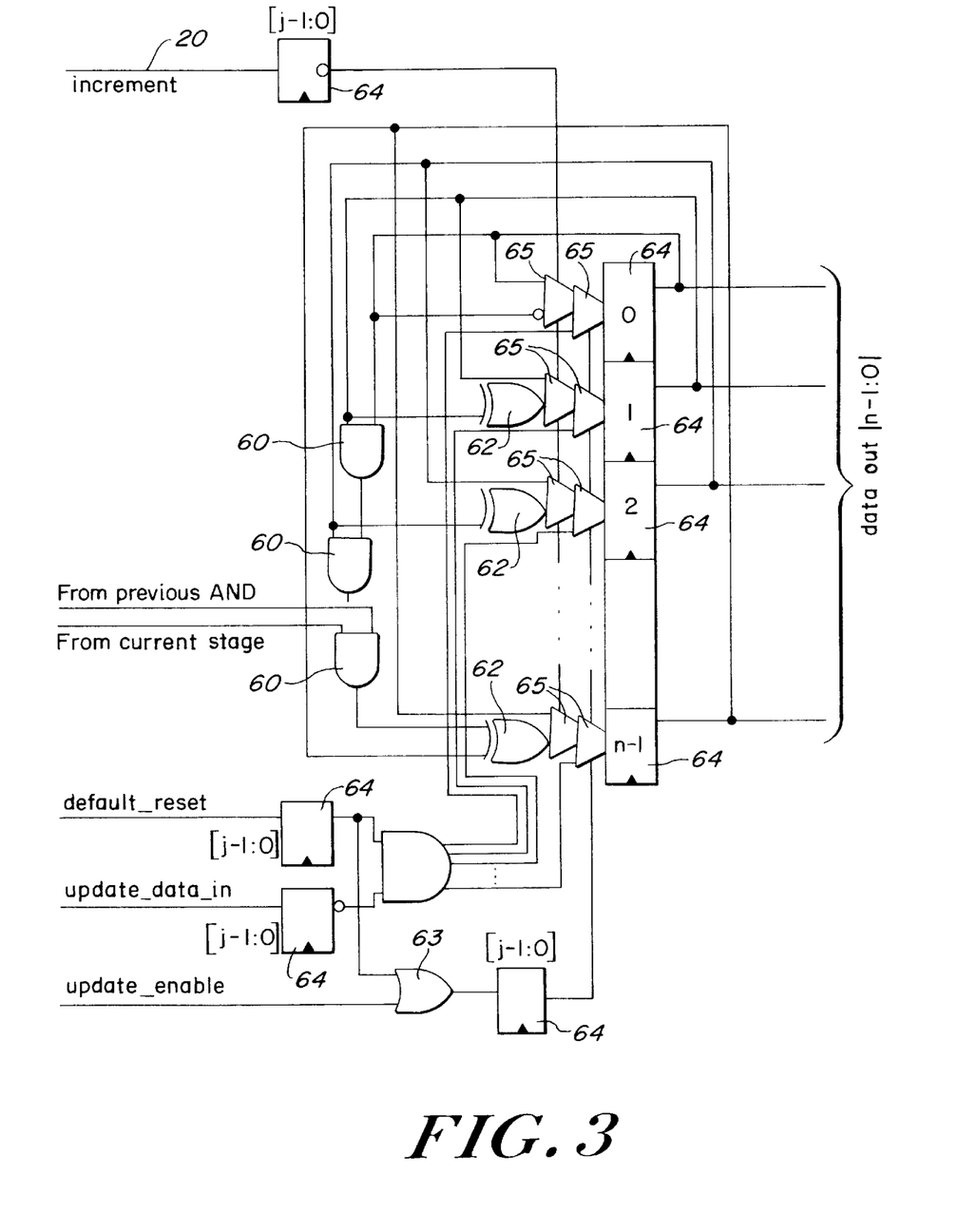
FIG. 3 shows the architecture of the slow counter 24 of FIG. 1 in more detail.

Referring to FIG. 3, a slow counter 14 is shown that includes AND gates 60, exclusive OR gates 62, and an OR gate 63. A coupling lead 20 couples the slow counter 14 to the fast counter 12. The slow counter 14 includes n registers (four are shown in FIG. 3). The slow counter also includes several multiplexers 65, known as two-to-one multiplexers, that each have two data input lines and one select input line.

The operation of the slow counter 14 is similar to the operation of the fast counter 12 described above. The slow counter 14 is n bits wide and is incremented every time its increment signal is asserted by the m-bit fast counter 12. Therefore, the slow counter 14 has $2^m$ clock cycles to change its state from x−1 to x. For some practical applications, one slow counter 14 is sufficient; however, if necessary, the slow counter 14 can be divided into two or more slow counters such that slow counter i creates the increment signal for slow counter i+1. The slow counter i+1 increments its state on the rising edge of the clock when the increment signal from the slow counter i is asserted.

The time necessary for the slow counter i+1 to increment its state is a function of the accumulative length of all stages of counters up to and including stage i. The accumulative length, s, is given by $$s(i) = \sum_{j=0}^{i} k[j]$$

where i is the index of the slow counter, j is the index referring to the counter stages and k is the length of each counter. The accumulative length of the counter may be used to compute the time allowed for the counter stage i+1 to make a transition to its next state, T(i+1):

$$T(i+1) = 2^{s(i)}$$

The number of levels of logic for each bit of the counter can be extracted from the structure of the binary counter. This level depends on some capabilities of the counter such as reset, parallel load, etc. By knowing the maximum number of levels that could be accommodated in one cycle and the clock rate of the design, the number and length of each counter stage is computed. The proposed architecture creates a cycle accurate binary counter that can be reset to a default value or parallel loaded to an initial value if necessary.

The integer j in FIG. 3 is a technology dependent number and is maximum drive capability of latches/flops in the target technology.

Figure 4:
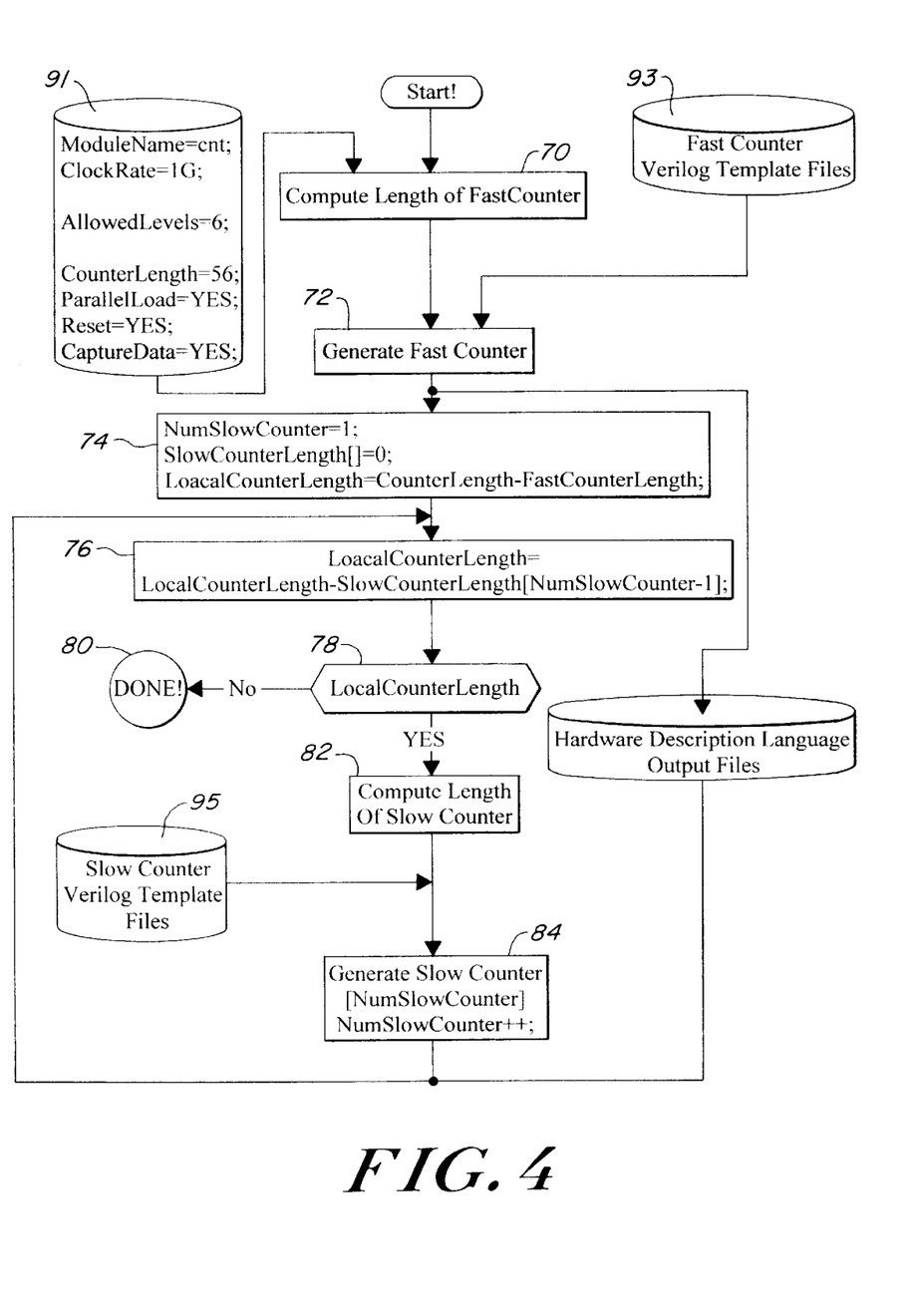
FIG. 4 shows an overview of the binary counter generation framework provided by one embodiment of the present invention.

Referring to FIG. 4, a flow chart of the steps that are performed to create a binary counter is shown. Given the characteristics of a binary counter, the binary counter framework generates the HDL model of a binary counter such that the timing constraints are satisfied. In step 70, the length of the fast counter 12 is computed. A Parameter Input File (PIF) 91, an HDL fast counter file 93, and an HDL slow counter file 95 for electronic design and gate level simulation, such as IEEE standard Verilog, are input. The PIF file 91 is user generated and can include various parameters detailed below.

The provided parameters are used to automatically generate a behavioral description of the binary counter. To reduce the complexity of creating the generation framework, one could use an HDL fast counter file 93, and an HDL slow counter file 95, such as a Verilog template file. Such template files possess an incomplete HDL description of a binary counter. A series of stylized comments and variables are placed in the template file to allow the framework to customize the HDL template file.

In one embodiment, a Verilog template file may be utilized to implement a generic encoder function, which is an inverse of a one-hot decoder. The encoder.template is a non-synthesizable Verilog code and one can write a simple Perl like program, i.e., sed & awk, to generate the appropriate parameters. An intermediate file, encoder.vp, may be generated. The non-synthesizable Verilog code in the encoder.vp file may be converted into Verilog code, encoder.v, by using another expansion, with the help of VPERL (a sub-set of Perl), for example. The encoder.v is a legal Verilog code that can be synthesized, thus saving a Verilog designer some time.

In step 72, the fast counter 12 is generated. The fast counter generation step 72 uses the user specified information in the PIF file 91 and the equations developed earlier to compute the length of the fast counter. Then, the HDL generation algorithm modifies a copy of the fast counter template file based on the computed information and PIF to generate a complete HDL description of the fast counter. The fast counter is a component of the binary counter being generated. The micro-architecture of the fast binary counter, i.e., 1-hot shift register vs. an incrementor, could also be considered while generating the fast counter.

In step 74, the number of slow counters, the slow counter length, which is an array representing the length of each slow counter, and the local counter length, which equals the counter length minus the fast counter length, are initialized. The local counter length is first set to the length of the binary counter. In step 76, the value of the local counter length is updated by subtracting the length of the slow counter from it. Since the slow counter length is initialized to zero, the value of the local counter length remains unchanged for the first time this statement is executed. A branch in the flow occurs in step 78 that depends on whether the local counter length variable is non-zero. If it is not non-zero, the flow exits in step 80 since there is no need to generate any more counters. Otherwise, if it is non-zero, then in step 82, the length of the next counter is computed based on the PIF files 91, the slow counter length, and the equations developed earlier. In step 84, the slow counter is generated. A copy of the template HDL files for the slow counter is modified to satisfy the specifications of the slow counter. The slow counters are a component of the binary counter and are added to the design. The necessary capture latches are also created and added to the design if necessary. This process is continued until all necessary slow counters are generated.

The at-speed binary counter 10 is scalable because the counter can be made larger or smaller, and is multi-stage because the counter consists of multiple smaller counters that allow its large width and high speed. Moreover, the binary counter 10 is cycle accurate since the counter has the correct count at any given time, and at-speed since it can be run at high clock rates. Reset modes can be reset to a default value or could be initialized to an initial value in parallel. An automatic generation process that uses the proposed architecture of the binary counters can determine the size and type (1-hot vs. specified parameters incrementor) of the fast counter automatically based on user specified parameters. In addition, the automatic generation process can determine the number of stages necessary to realize a counter that meets the timing and width constraint, and can automatically add the reset modes. Moreover, the automatic generation process can generate both VHDL/Verilog description of the counter and a generic timing file for the modeled counter.

Figure 5:
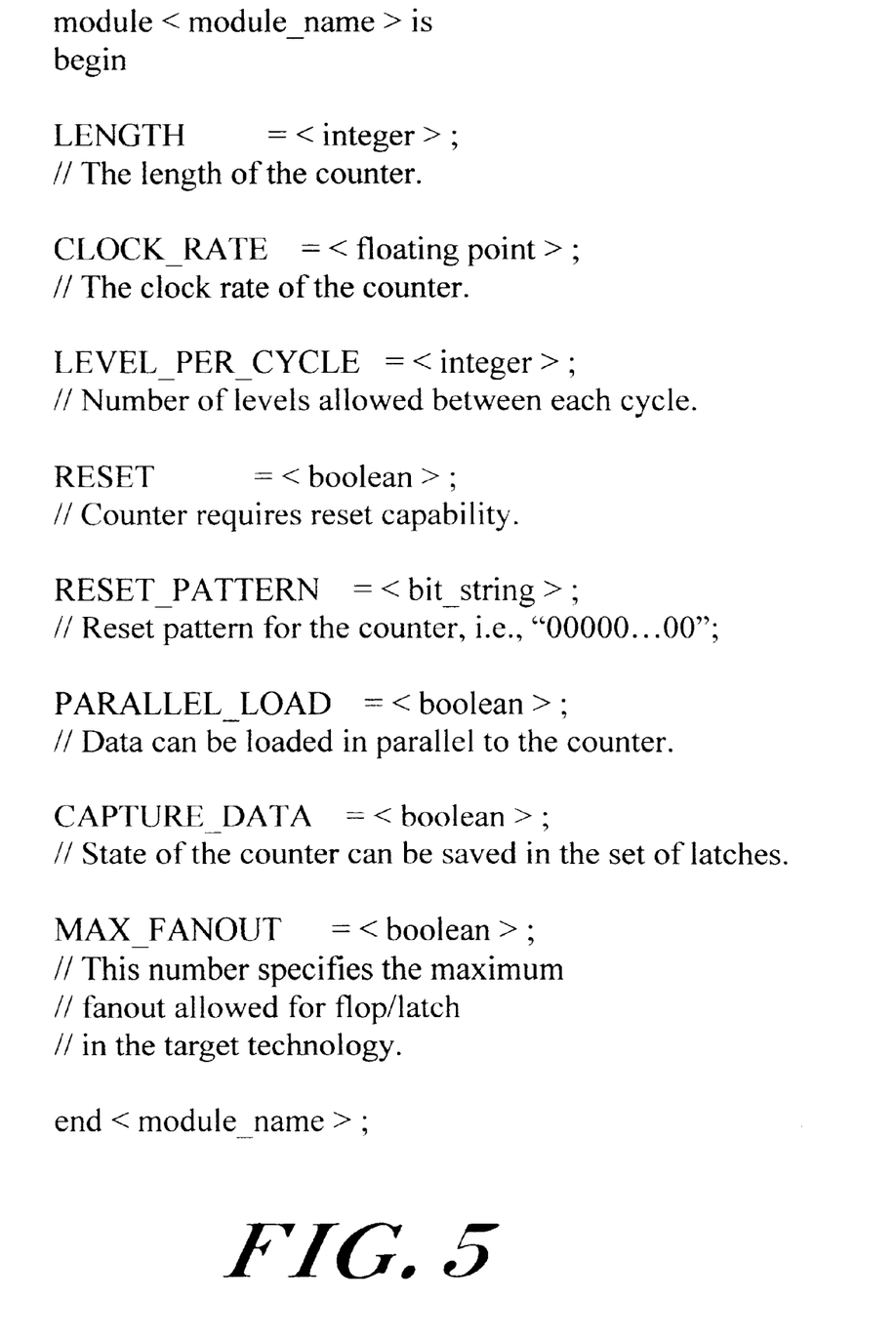
FIG. 5 is an example of an input file for the generation of a binary counter according to one embodiment of the present invention.

Referring to FIG. 5, an example of an input file 91 for the binary counter is shown. The input file can include the following parameters:

ModuleName: Name of the binary counter.

ClockRate: The speed of the clock of the design.

LevelsAllowed: The number of levels of combinational logic (2-input NAND gate that logic value V can propagate through in one clock cycle.

CounterLength: The length of the desired counter.

ParallelLoad: Indicates if the counter can be parallel loaded with initial value.

Reset: Specifies if the counter can be reset.

CaptureData: Indicates if the contents of the counter can be captured in a set of shadow registers.

MaxFanout: This number specifies the maximum fanout allowed for flop/latch in the target technology.

Figure 6:
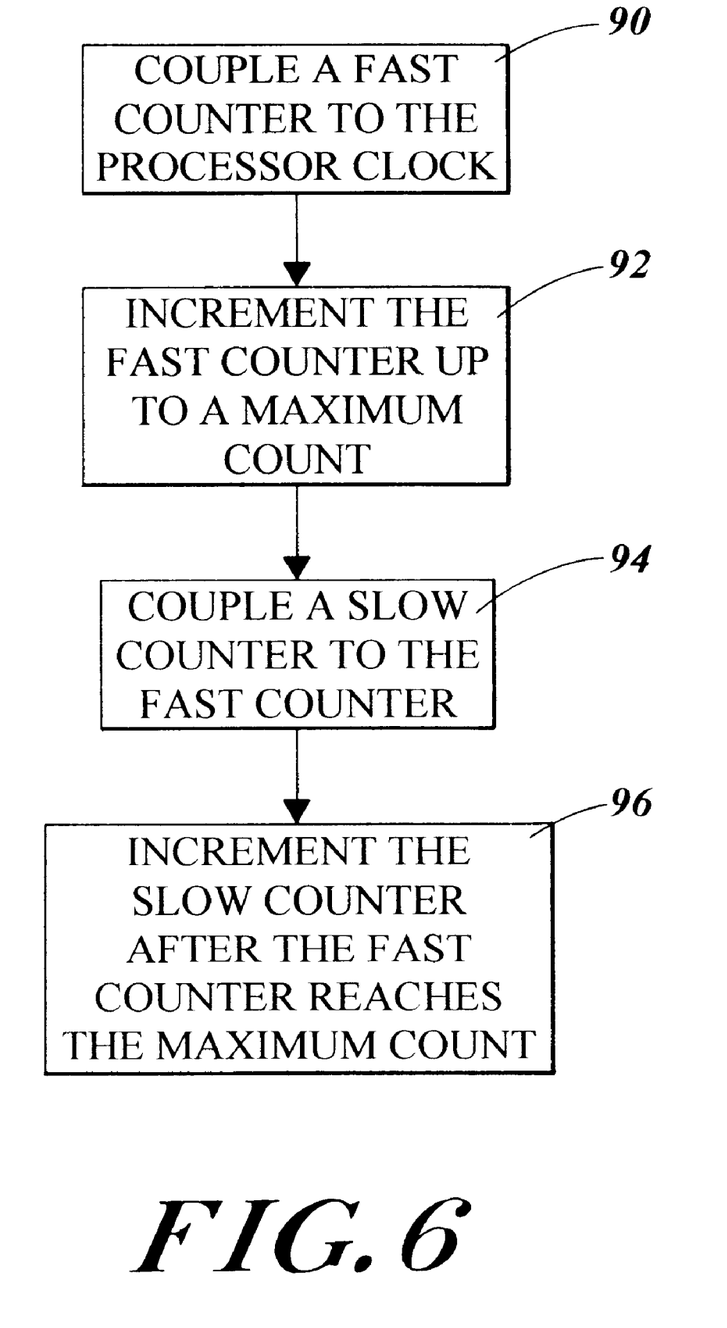
FIG. 6 is a flow chart of the steps performed to use an at-speed binary counter according to one embodiment of the present invention.

Referring to FIG. 6, a flow chart is shown for an at-speed binary counter according to one embodiment of the present invention. In step 90, a fast counter is coupled to the processor clock via at least one first clock input. In step 92, the fast counter is incremented by one after every cycle of the processor clock up to a maximum count. In step 94, a slow counter is coupled to the fast counter and to at least one second clock input. Subsequently, in step 96, the slow counter is incremented by one after one cycle of the processor clock after the fast counter reaches the maximum count.

While the present invention has been described with reference to illustrative embodiments thereof, those skilled in the art will appreciate that various changes in form and detail may be made without departing from the intended scope of the present invention as defined in the appended claims.

What is claimed:

1. A counter for counting cycles of a processor clock comprising
   a fast counter having a first input node to receive the processor clock and a first output node for use in outputting a control signal, said fast counter incrementing by one after every cycle of the processor clock up to a maximum count; and
   a slow counter having a first input node to receive the processor clock and a second input to receive said control signal, wherein the slow counter in response to said control signal increments by one after one cycle of the processor clock.

2. The counter of claim 1, wherein the slow counter increments on a rising edge of the processor clock.

3. The counter of claim 1, wherein the fast counter includes at least one AND gate.

4. The counter of claim 1, wherein the fast counter includes at least one OR gate.

5. The counter of claim 1, wherein the fast counter includes one register coupled to said processor clock.

6. The counter of claim 1, wherein said fast counter further comprises;
   a plurality of registers; and
   a plurality of multiplexers coupled to the plurality of registers, wherein the plurality of multiplexers are adapted to provide said plurality of registers with a selected value.

7. The counter of claim 1, wherein the fast counter further comprises a second input to receive a reset signal to reset the counter.

8. The counter of claim 1, wherein the fast counter includes a second input to receive a reset signal to reset the counter to a value different from zero.

9. The counter of claim 1, wherein the slow counter includes at least one AND gate.

10. The counter of claim 1, wherein the slow counter includes at least one OR gate.

11. The counter of claim 1, wherein the slow counter includes one register for each of the at least one second clock input.

12. The counter of claim 1, wherein said slow counter further comprises a plurality of registers for holding one or more values.

13. The counter of claim 1, wherein the slow counter further comprises a third input to receive a reset signal to reset the counter.

14. The counter of claim 1, wherein the slow counter further comprises a third input to receive a reset signal to reset the counter to a value different from zero.

15. A method for counting cycles of a processor clock comprising
   coupling a fast counter to the processor clock via at least one first clock input;
   incrementing the fast counter by one after every cycle of the processor clock up to a maximum count;
   coupling a slow counter to said fast counter and to the processor clock; and
   incrementing the slow counter by one after one cycle of the processor clock after the fast counter reaches the maximum count.

16. The method of claim 15, wherein, in the step of incrementing the slow counter, the slow counter increments on a rising edge of the processor clock.

17. The method of claim 15, wherein, in the step of coupling a fast counter, the fast counter includes a plurality of registers with at least one register connected to the processor clock.

18. The method of claim 17, wherein, in the step of incrementing the fast counter, each of the plurality of registers accepts signals via a multiplexer.

19. The method of claim 15, wherein, in the step of coupling a fast counter, the fast counter includes a reset input for receiving a reset signal.

20. The method of claim 15, wherein, in the step of coupling a fast counter, the fast counter includes an in input for receiving a reset signal for resetting said fast counter to a value different from zero.

21. The method of claim 15, wherein, in the step of coupling a slow counter, the slow counter includes a plurality of registers and one of said registers being coupled to the processor clock.

22. The method of claim 21, wherein, in the step of incrementing the slow counter, each of said registers accepts values via a multiplexer.

* * * * *